United States Patent
Lassini et al.

(10) Patent No.: US 10,365,047 B2
(45) Date of Patent: Jul. 30, 2019

(54) ELECTRONICS COOLING WITH MULTI-PHASE HEAT EXCHANGE AND HEAT SPREADER

(71) Applicant: GE Aviation Systems LLC, Grand Rapids, MI (US)

(72) Inventors: Stefano Lassini, Lowell, MI (US); Brian Rush, Niskayuna, NY (US); Daniel Erno, Niskayuna, NY (US); William Dwight Gerstler, Niskayuna, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 15/497,520

(22) Filed: Apr. 26, 2017

(65) Prior Publication Data
US 2017/0363363 A1  Dec. 21, 2017

Related U.S. Application Data

(60) Provisional application No. 62/352,862, filed on Jun. 21, 2016.

(51) Int. Cl.
*F28F 7/00* (2006.01)
*F28D 15/04* (2006.01)
(Continued)

(52) U.S. Cl.
CPC ........... *F28D 15/04* (2013.01); *F28D 7/0025* (2013.01); *F28D 7/0066* (2013.01);
(Continued)

(58) Field of Classification Search
CPC ...... F28D 15/04; F28D 7/0025; F28D 7/0066; F28D 9/0093; F28D 15/0233;
(Continued)

(56) References Cited

U.S. PATENT DOCUMENTS 2,451,692 A   10/1948   Pugh
3,777,975 A * 12/1973   Kofink ................... B60H 1/032
                                                  237/12.3 A
(Continued)

FOREIGN PATENT DOCUMENTS

CN       1201704 A     12/1998
CN      104776740 A     7/2015
(Continued)

OTHER PUBLICATIONS

U.S. Appl. No. 14/592,387, filed Jan. 8, 2015.
(Continued)

*Primary Examiner* — Davis D Hwu
(74) *Attorney, Agent, or Firm* — Dority & Manning, P.A.

(57) ABSTRACT

One example aspect of the present disclosure is directed to a system for cooling a surface. The system can include a housing. The housing can include an evaporator portion. The housing can include at least one trifurcated heat exchange portion. The at least one trifurcated heat exchange portion can include a condenser portion coupled to the evaporator portion. The at least one trifurcated heat exchange portion can include a coolant portion substantially surrounded by the condenser portion. The at least one trifurcated heat exchange portion can include a phase change material portion substantially surrounding the condenser portion.

20 Claims, 10 Drawing Sheets

(51) Int. Cl.
| | | |
|---|---|---|
| *F28D 9/00* | (2006.01) | |
| *F28F 7/02* | (2006.01) | |
| *F28D 15/02* | (2006.01) | |
| *H05K 7/20* | (2006.01) | |
| *F28D 7/00* | (2006.01) | |
| *F28D 20/02* | (2006.01) | |
| *F28F 1/04* | (2006.01) | |
| *H01L 23/427* | (2006.01) | |

(52) U.S. Cl.
CPC ....... *F28D 9/0093* (2013.01); *F28D 15/0233* (2013.01); *F28D 15/0266* (2013.01); *F28D 15/0275* (2013.01); *F28D 20/021* (2013.01); *F28F 1/045* (2013.01); *F28F 7/02* (2013.01); *H01L 23/427* (2013.01); *H05K 7/20309* (2013.01); *H05K 7/20318* (2013.01); *H05K 7/20336* (2013.01); *F28F 2270/00* (2013.01); *Y02E 60/145* (2013.01)

(58) Field of Classification Search
CPC . F28D 15/0266; F28D 15/0275; H05K 7/203; H05K 7/20309; H05K 7/20318; H05K 7/20336; H01L 23/427; F25B 39/04
USPC ........................................................ 165/80.2
See application file for complete search history.

(56) References Cited

U.S. PATENT DOCUMENTS

| | | | |
|---|---|---|---|
| 4,700,773 | A | 10/1987 | Kehrer |
| 4,771,365 | A | 9/1988 | Chichocki et al. |
| 4,915,164 | A | 4/1990 | Harper |
| 5,227,957 | A | 7/1993 | Deters |
| 5,283,715 | A | 2/1994 | Carlsten et al. |
| 5,343,632 | A | 9/1994 | Dinh |
| 5,439,351 | A | 8/1995 | Artt |
| 5,761,909 | A | 6/1998 | Hughes et al. |
| 5,899,265 | A | 5/1999 | Schneider et al. |
| 5,975,841 | A | 11/1999 | Lindemuth et al. |
| 6,233,150 | B1 | 5/2001 | Lin et al. |
| 6,359,218 | B1 | 3/2002 | Koch et al. |
| 6,360,813 | B1 | 3/2002 | Katoh et al. |
| 6,378,605 | B1 | 4/2002 | Kutscher et al. |
| 6,392,883 | B1 | 5/2002 | Ali |
| 6,430,931 | B1 | 8/2002 | Horner |
| 6,889,755 | B2 | 5/2005 | Zuo et al. |
| 6,983,790 | B2 | 1/2006 | Ippoushi et al. |
| 7,002,247 | B2 | 2/2006 | Mok et al. |
| 7,007,741 | B2 | 3/2006 | Sen et al. |
| 7,032,654 | B2 | 4/2006 | Wand et al. |
| 7,189,064 | B2 | 3/2007 | Helder et al. |
| 7,256,992 | B1 | 8/2007 | Stewart et al. |
| 7,369,410 | B2 | 5/2008 | Chen et al. |
| 7,377,098 | B2 | 5/2008 | Walker et al. |
| 7,473,995 | B2 | 1/2009 | Rumer et al. |
| 7,594,537 | B2 | 9/2009 | Hou et al. |
| 7,704,565 | B2 | 4/2010 | Slaughter |
| 7,768,783 | B1 | 8/2010 | Kajiya et al. |
| 7,871,578 | B2 | 1/2011 | Schmidt |
| 7,900,438 | B2 | 3/2011 | Venkataramani et al. |
| 7,907,409 | B2 | 3/2011 | Wyatt et al. |
| 7,928,562 | B2 | 4/2011 | Arvelo et al. |
| 7,942,025 | B1 | 5/2011 | Musone |
| 8,047,269 | B2 | 11/2011 | Kang et al. |
| 8,109,324 | B2 | 2/2012 | Farid et al. |
| 8,176,972 | B2 | 5/2012 | Mok |
| 8,323,122 | B2 | 12/2012 | Soracco et al. |
| 8,466,486 | B2 | 6/2013 | Yuan |
| 8,475,112 | B1 | 7/2013 | Ryznic et al. |
| 8,549,749 | B2 | 10/2013 | Zimbeck et al. |
| 8,610,761 | B2 | 12/2013 | Haisty et al. |
| 8,616,834 | B2 | 12/2013 | Knight, III et al. |
| 8,656,722 | B2 | 2/2014 | Norris et al. |
| 8,937,384 | B2 | 1/2015 | Bao et al. |
| 9,476,651 | B2 | 10/2016 | Thiagarajan et al. |
| 9,516,791 | B2 | 12/2016 | Chester et al. |
| D818,093 | S | 5/2018 | Erno et al. |
| 2002/0021556 | A1 | 2/2002 | Dibene et al. |
| 2003/0043547 | A1 | 3/2003 | Nealis et al. |
| 2004/0129032 | A1 | 7/2004 | Severns et al. |
| 2007/0012429 | A1 | 1/2007 | Siu |
| 2007/0017659 | A1 | 1/2007 | Brunschwiler et al. |
| 2008/0149299 | A1 | 6/2008 | Slaughter |
| 2008/0170368 | A1 | 7/2008 | Chen et al. |
| 2008/0235977 | A1 | 10/2008 | Kuwabara |
| 2009/0040726 | A1 | 2/2009 | Hoffman et al. |
| 2009/0244830 | A1 | 10/2009 | Wyatt et al. |
| 2010/0065256 | A1 | 3/2010 | Wilcoxon et al. |
| 2010/0170101 | A1 | 7/2010 | Taniguchi et al. |
| 2010/0200199 | A1 | 8/2010 | Habib et al. |
| 2010/0320187 | A1 | 12/2010 | Griffin et al. |
| 2011/0016886 | A1 | 1/2011 | Ghoshal et al. |
| 2011/0209864 | A1 | 9/2011 | Figus et al. |
| 2011/0232877 | A1 | 9/2011 | Meyer, IV et al. |
| 2011/0259041 | A1* | 10/2011 | Kuehl ............. F25B 39/04 62/507 |
| 2012/0110869 | A1 | 5/2012 | Bellinger et al. |
| 2012/0250259 | A1 | 10/2012 | Lee et al. |
| 2012/0331269 | A1 | 12/2012 | Aras |
| 2013/0008632 | A1 | 1/2013 | Brunschwiler et al. |
| 2013/0079693 | A1 | 3/2013 | Ranky et al. |
| 2013/0098417 | A1 | 4/2013 | Gavillet |
| 2013/0105122 | A1* | 5/2013 | Campbell ......... H05K 7/203 165/104.26 |
| 2013/0189594 | A1 | 7/2013 | Breit et al. |
| 2013/0206374 | A1 | 8/2013 | Rosin et al. |
| 2014/0014493 | A1 | 1/2014 | Ryan |
| 2014/0037873 | A1 | 2/2014 | Cheung et al. |
| 2014/0083653 | A1 | 3/2014 | Kempers et al. |
| 2014/0158334 | A1 | 6/2014 | Dellea et al. |
| 2014/0163445 | A1 | 6/2014 | Pallari et al. |
| 2014/0174086 | A1 | 6/2014 | Kare et al. |
| 2014/0190667 | A1 | 7/2014 | McGlen et al. |
| 2014/0251585 | A1 | 9/2014 | Kusuda et al. |
| 2014/0268831 | A1 | 9/2014 | Shih et al. |
| 2014/0321998 | A1 | 10/2014 | Maar et al. |
| 2015/0000871 | A1 | 1/2015 | Farmer et al. |
| 2015/0027669 | A1 | 1/2015 | Kokas et al. |
| 2015/0040888 | A1 | 2/2015 | Zakhidov et al. |
| 2015/0080495 | A1 | 3/2015 | Heikkila |
| 2015/0289413 | A1 | 10/2015 | Rush et al. |
| 2015/0366105 | A1 | 12/2015 | Dunwoody et al. |
| 2016/0116218 | A1 | 4/2016 | Shedd et al. |
| 2016/0202003 | A1 | 7/2016 | Gerstler et al. |
| 2017/0276440 | A1 | 9/2017 | Kenworthy et al. |

FOREIGN PATENT DOCUMENTS

| | | | |
|---|---|---|---|
| DE | 2837802 A1 | | 8/1979 |
| DE | 102011086786 B3 | | 3/2013 |
| EP | 1054583 A2 | | 11/2000 |
| GB | 2476253 A | | 6/2011 |
| JP | 09004962 | * | 1/1997 |
| TW | I289655 B | | 11/2007 |
| WO | WO2016/057471 A1 | | 4/2016 |

OTHER PUBLICATIONS

U.S. Appl. No. 14/848,860, filed Sep. 9, 2015.
U.S. Appl. No. 15/237,054, filed Aug. 15, 2016.
U.S. Appl. No. 15/399,935, filed Jan. 6, 2017.
U.S. Appl. No. 15/228,336, filed Aug. 4, 2016.
U.S. Appl. No. 15/397,234, filed Jan. 3, 2017.
Brown et al.,"Thermal management issues and evaluation of a novel, flexible substrate, 3-dimensional (3-D) packaging concept", Multichip Modules and High Density Packaging, 1998. Proceedings. 1998 International Conference on, Apr. 15-17, 1998, pp. 135-140, Denver, CO.
Rawal et al., "Thermal management for multifunctional structures", Advanced Packaging, IEEE Transactions on, Aug. 1999, pp. 379-383, vol. 22 , Issue: 3, Denver, CO.

(56) References Cited

OTHER PUBLICATIONS

Hara et al., "Optimization for Chip Stack in 3-D Packaging", Advanced Packaging, IEEE Transactions on, Aug. 2005, pp. 367-376, vol. 28, Issue: 3.

Wu et al., "Investigation of the Polymer Wick Structure Applied to Loop Heat Pipe", 2009 4th International Microsystems, Packaging, Assembly and Circuits Technology Conference, pp. 368-371, Oct. 21-23, 2009.

Ameli et al., "A Novel Method for Manufacturing Sintered Aluminium Heat Pipes (SAHP)", Applied Thermal Engineering, vol. No. 52, Issue No. 2, pp. 498-504, Apr. 15, 2013.

Green et al., "Dynamic Thermal management of high heat flux devices using embedded solid-liquid phase change materials and solid state coolers", Thermal and Thermomechanical Phenomena in Electronic Systems, 13th IEEE Intersociety Conference on May 30, 2012-Jun. 1, 2012, pp. 853-862, 2012.

"Engineers guide to military aerospace and avionics", Application Solutions, Extension Media, 2014, p. 36.

"Subracks", Enclosure Frames, Pixux Technologies.

Brackett et al.,"Topology Optimization for Additive Manufacturing", Wolfson School of Mechanical and Manufacturing Engineering, Loughborough University,Aug. 17, 2011,pp. 348-362, Loughborough, Leicestershire, LE11 3TU, UK.

Brotan.V et al., "The hybrid manufacturing cell: Determining key parameters in the integration of powder bed fusion with high speed milling", Industrial Engineering and Engineering Management (IEEM), 2012 IEEE International Conference on, Dec. 10-13, 2012, pp. 583-587, Location:Hong Kong.

"Air Pollution Control Technology Fact Sheet," Wet Electrostatic Precipitator (ESP)—Wire-Pipe Type, EPA-452/F-03-029, Retrieved from Internet URL: https://www3.epa.gov/ttnchie1/mkb/documents/fwespwpi.pdf, pp. 1-4 (Oct. 23, 2018).

"Battery Prognostics-Prognosis Framework," National Aeronautics and Space Administration, Retrieved from Internet URL: http://ti.arc.nasa.gOIn'tech/dash/pcoe/battery-pragnostics/pragnosis-framev.orW, pp. 1-3 (May 8, 2014).

"Building Energy Efficiency Frontiers and Incubator Technologies (Benefit)—2014," Funding Opportunity Announcement (FOA) No. DE-FOA-0001027, pp. 1-94 (2014).

"Energy Star® Emerging Technology Award Requirements: Advanced Dryers," Retrieved from the Internet URL: http://www.energystar.gov/ia/partners/pt_awards/documents/2012_ENERGY_STAR_Emerging_Technology_Award_Advanced_Clothes_Dryers_Requirements.pdf?5dbd-e858&877d-d14f on Oct. 18, 2018, p. 1 (Feb. 9, 2012).

"Radiant Heating With Infrared—A Technical Guide to Understanding and Applying Infrared Heaters," Watlow Electric Manufacturing Company, pp. 1-39 (1997).

"Residential Clothes Dryers," Energy Star Market & Industry Scoping Report: Dryers, pp. 1-18 (Nov. 2011).

Arif-Uz-Zaman, M., et al., "A Novel Dehumidification Technique Using Electric Field," IEEE Transactions on Industry Applications, vol. 32, Issue 1, pp. 36-40 (Jan./Feb. 1996).

Bendt, P., "Are We Missing Energy Savings in Clothes Dryers?," ACEEE Summer Study on Energy Efficiency in Buildings, pp. 9-42-9-55 (2010).

Buckley, W., et al., "Application of Wet Electrostatic Precipitation Technology in the Utility Industry for Multiple Pollutant Control Including Mercury," Croll-Reynolds Clean Air Technologies, pp. 1-14 (2003).

Buekens, A., "Electrostatic Precipitators," Pollution Control Technologies, Encyclopedia of Life Support Systems (EOLSS), vol. 1, pp. 1-9 (2008).

Lee, M., "Ventless Drying—The New Standard of Efficiency," Retrieved from the Internet URL: http://thorwasherdryers.blogspot.in/2010/07/fi1.e-most-coomon-nisconceptions about.html, on Oct. 18, 2018, pp. 1-2 (Jul. 30, 2010).

Pingsheng, G., and Haili, L., "Effect of Charge on Growth of Droplets with Ionic Condensation Nuclei," Chinese Science Bulletin, vol. 56, No. 18, pp. 1942-1946 (Jun. 2011).

Reznikov, M. A., et al., "Electrohydrodynamic Enforcement of Evaporation and Gas Flow," IEEE Transactions on Industry Applications, vol. 47, No. 2, pp. 1036-1042 (Mar./Apr. 2011).

Reznikov, M., and Willems, P., "Corona discharge in the steam for electrostatically enforced condensation," Proceedings 2012 Electrostatics Joint Conference, pp. 1-4 (Jun. 2012).

Salazar, M., et al., "Electrospray as an Enforcement of Steam Condensation," Proc. ESA Annual Meeting on Electrostatics, pp. 1-10 (2013).

Tapuchi, S., et al., "Obtaining Fresh Water from Atmosphere using Electrostatic Precipitation: Theory, Efficiency and Limitations," E-Water, Official Publication of the European Water Association (EWA) pp. 1-6 (2010).

Yang, F., "Corona-Driven Air Propulsion for Cooling of Microelectronics," Master of Science in Electrical Engineering, pp. 1-81, Mamishev, A., et al., eds. (2002).

Gerstler, W. D., et al., Systems and methods for using additive manufacturing for thermal management, GE Co-Pending U.S. Appl. No. 61/976,649, filed Apr. 8, 2014.

Erno, D. J., et al., Multi-branch furcating flow heat exchanger, GE Co-Pending U.S. Appl. No. 62/060,719, filed Oct. 7, 2014.

* cited by examiner ly to refer"># ELECTRONICS COOLING WITH MULTI-PHASE HEAT EXCHANGE AND HEAT SPREADER This application claims the benefit of priority of U.S. Provisional Application No. 62/352,862 filed Jun. 21, 2016, which is incorporated by reference.

TECHNICAL FIELD

The subject disclosure generally relates to a compact and efficient method to cool heat producing components via three dimensional conformal vapor chamber heat spreaders closely coupled with multi-domain heat exchangers.

BACKGROUND

In typical convection cooling systems, heat is often spread, shifted or otherwise transferred from heat producing components to a series of fins for heat removal. Air outside the fins lifts, carries away or otherwise removes the heat from the fins. In some situations, the air may be cooled, for example, by an air conditioning system, wherein the air acts an intermediary fluid to carry the heat to a heat exchanger included in the air conditioning system. It is readily apparent that this can be inefficient, and require additional space and weight overhead. Additionally, in applications where the air outside the fins is hotter than the heat being ejected, a convection cooling system can be ineffective. For example, where the local ambient environment is subject to additional heat producing components, the convection cooling system may be unable to effectively remove heat form the heating producing component to which it is coupled.

SUMMARY

The following presents a simplified summary of the specification in order to provide a basic understanding of some aspects of the specification. This summary is not an extensive overview of the specification. It is intended to neither identify key or critical elements of the specification nor delineate any scope particular embodiments of the specification, or any scope of the claims. Its sole purpose is to present some concepts of the specification in a simplified form as a prelude to the more detailed description that is presented later.

One example aspect of the present disclosure is directed to a system for cooling a surface. The system can include a housing. The housing can include an evaporator portion. The housing can include at least one trifurcated heat exchange portion. The at least one trifurcated heat exchange portion can include a condenser portion coupled to the evaporator portion. The at least one trifurcated heat exchange portion can include a coolant portion substantially surrounded by the condenser portion. The at least one trifurcated heat exchange portion can include a phase change material portion substantially surrounding the condenser portion.

Another example aspect of the present disclosure is directed to a system for cooling a surface. The system can include a first structure forming a first cavity. Coolant can be disposed in the first cavity. The system can include a second structure. A first chamber can be formed between at least portions of the first structure and at least portions of the second structure. The first chamber can include a heat transfer substance. The system can include a third structure. A second chamber can be formed between at least portions of the second structure and at least portions of the third structure. The second chamber can include a phase change material. The system can include a fourth structure forming a second cavity. The second cavity can be in communication with the first chamber. The fourth structure can be in communication with the surface. The second cavity can include the heat transfer substance.

Another example aspect of the present disclosure is directed to a system for cooling electronics. The system can include a multi-phase heat exchanger. The system can include a heat spreader. The heat spreader can include a vapor chamber.

Other example aspects of the present disclosure are directed to systems, methods, power plants, devices, non-transitory computer-readable media for cooling a surface. Variations and modifications can be made to these example aspects of the present disclosure.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

DETAILED DESCRIPTION

Figure 1:
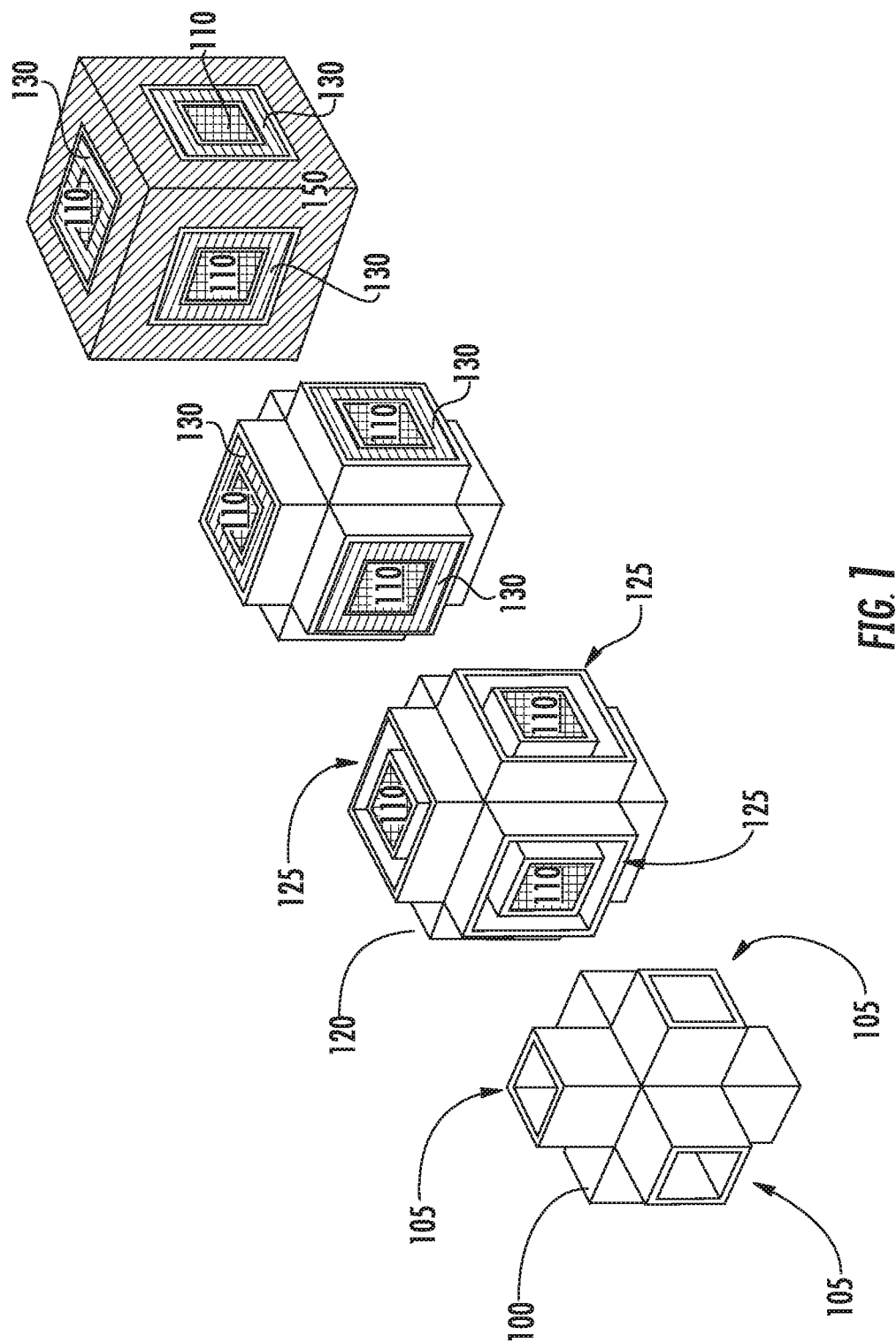
FIG. 1 illustrates example exploded views of the heat exchanger domains in accordance with various aspects described herein.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

As used in the specification and the appended claims, the singular forms "a," "an," and "the" include plural referents unless the context clearly dictates otherwise. As used herein, when a first structure is "substantially surrounding" a second structure, then the first structure surrounds at least 66% of the second structure. As used herein, when a first structure is "substantially surrounded by" a second structure, then at least 66% of the first structure is surrounded by the second structure.

As noted in the Background section, typical convection cooling systems remove heat by transferring it from heat producing components to a series of fins. Air outside the fins lifts, carries away or otherwise removes the heat from the fins. In applications where the air outside the fins is not significantly hotter than the fins, a convection cooling system can be ineffective. For example, where the ambient environment is subject to additional heat producing components, the convection cooling system may be unable to effectively remove heat from the heat producing component to which it is coupled. Cooling the air via an air conditioning system can be inefficient, and require additional space and weight overhead.

Accordingly, one non-limiting intent of the disclosed subject matter is to provide for efficient heat transfer from a hot spot to one or more domains of a heat exchanger system. A first domain of the heat exchanger system can include a vapor chamber. A second domain of the heat exchanger system can include a fluid cooling (or heating) loop for providing efficient cooling (or heating) for the vapor chamber, and thus for an electronic component. A third domain of the heat exchanger system can include a phase change material. A fourth domain of the heat exchanger system can include a vacuum.

In one embodiment, the vapor chamber can be a three dimensional (3D) Conformal Vapor Chamber (CVC) configured in such a way that an evaporator section of the 3D CVC is closely mated to an electronic circuit board or to a set of electronic components (e.g., heat generating components), so that the 3D CVC can provide cooling to the electronic circuit board or set of electronic components. The evaporator section and a condenser section of the 3D CVC can be configured to form the first domain of a heat exchanger system. The 3D CVC and the heat exchanger system can be realized in a single part, component or piece via additive manufacturing.

In an additional or alternative embodiment, the 3D CVC Evaporator is connected to a 3D CVC condenser which forms one domain of a multi-domain (e.g., 2 or more domains) heat exchanger. For example, at least one of the remaining or other domains of the heat exchanger can be used to provide the 3D CVC condenser with a cooling fluid. Additionally or alternatively, at least one of the remaining heat exchanger domains can be filled with a Phase Change Material (PCM). For instance, the PCM can be of a reversible type (e.g., paraffin wax, etc.) or of the irreversible type (e.g., water being evaporated, with the vapor being dispersed into the environment). Virtually any PCM can be used within the scope of this innovation. In another example, at least one of the remaining heat exchanger domains can be a vacuum.

Some embodiments can include a nested, trifurcated heat exchanger (HX) (or a trifurcated heat exchange portion), wherein the flow path for each fluid includes short flow lengths followed by hydrodynamic furcations that divide the flow and disrupt, interrupt or otherwise break the thermal boundary layer of the fluid. The paths can combine with other adjacent sections to form a new or additional short path, and the division and recombination of paths can be repeated. A similar pattern may be followed by other fluid/volume(s) with thin walls separating each. The heat exchanger can be applied to two fluid systems by plumbing at least two of the fluid domains to the same fluid source. Likewise, the heat exchanger can be applied to 3 or more fluids. A further embodiment includes using a phase change material in one of the volume domains, thus providing additional thermal capacitance over a particular temperature range. Other substances, or voids, can also be used as required in one or more of the volume domains. In an embodiment, the trifurcated heat exchanger can be surrounded by a vacuum—the vacuum can be the fourth domain.

In this way, the systems and methods according to example aspects of the present disclosure can have a number of technical effects and benefits. For instance, example aspects of the present disclosure can have a technical effect of cooling hot electronics to prevent damage to the electronics due to overheating.

In some embodiments, the systems and methods of the present disclosure also provide an improvement to a computing system. The system includes a housing. A housing can be an external wall surrounding one or more components. The housing includes an evaporator portion. The housing includes at least one trifurcated heat exchange portion. The at least one trifurcated heat exchange portion includes a condenser portion coupled to the evaporator portion. The at least one trifurcated heat exchange portion includes a coolant portion substantially surrounded by the condenser portion. The at least one trifurcated heat exchange portion includes a phase change portion substantially surrounding the condenser portion. This can help prevent damage to electronics of the computing system due to overheating.

One example aspect of the present disclosure is directed to a system for cooling a surface. The system can include a housing. The housing can include an evaporator portion. The housing can include at least one trifurcated heat exchange portion. The at least one trifurcated heat exchange portion can include a condenser portion coupled to the evaporator portion. The at least one trifurcated heat exchange portion can include a coolant portion substantially surrounded by the condenser portion. The at least one trifurcated heat exchange portion can include a phase change portion substantially surrounding the condenser portion.

In some embodiments, at least one of the evaporator portion and the condenser portion includes a heat exchange fluid. In some embodiments, at least one of the evaporator portion and the condenser portion includes at least one wall partially or fully lined with three dimensional conformal vapor chamber wicking structures. In some embodiments, the phase change material portion includes a phase change material. In some embodiments, the phase change material is of a reversible type. In some embodiments, the phase change material includes paraffin wax. In some embodiments, the phase change material is of an irreversible type. In some embodiments, the phase change material comprises water. In some embodiments, the housing can father include a vacuum portion.

Another example aspect of the present disclosure is directed to a system for cooling a surface. The system can include a first structure forming a first cavity. Coolant can be disposed in the first cavity. The system can include a second structure. A first chamber can be formed between at least portions of the first structure and at least portions of the second structure. The first chamber can include a heat transfer substance. The system can include a third structure. A second chamber can be formed between at least portions of the second structure and at least portions of the third structure. The second chamber can include a phase change material. The system can include a fourth structure forming a second cavity. The second cavity can be in communication with the first chamber. The fourth structure can be in communication with the surface. The second cavity can include the heat transfer substance.

In some embodiments, at least one of the first chamber and the second cavity includes a condenser. In some embodiments, at least one of the first chamber and the second cavity includes at least one wall partially or fully lined with three dimensional conformal vapor chamber wicking structures.

Another example aspect of the present disclosure is directed to a system for cooling electronics. The system can include a multi-phase heat exchanger. The system can include a heat spreader can include a three dimensional conformal vapor chamber.

In some embodiments, the three dimensional conformal vapor chamber is closely coupled with one or more multi-domain heat exchangers. In some embodiments, at least one of the domains includes a condenser of the vapor chamber. In some embodiments, at least one of the domains includes a coolant. In some embodiments, at least one of the domains includes phase change material. In some embodiments, the one or more multi-domain heat exchangers include three domains. In some embodiments, at least one of the multi-phase heat exchanger and the three dimensional conformal vapor chamber are at least partially enclosed in a vacuum domain. In some embodiments, the vacuum domain provides thermal insulation between an environment and at least one of the multi-phase heat exchanger and the three dimensional conformal vapor chamber.

Figure 2:
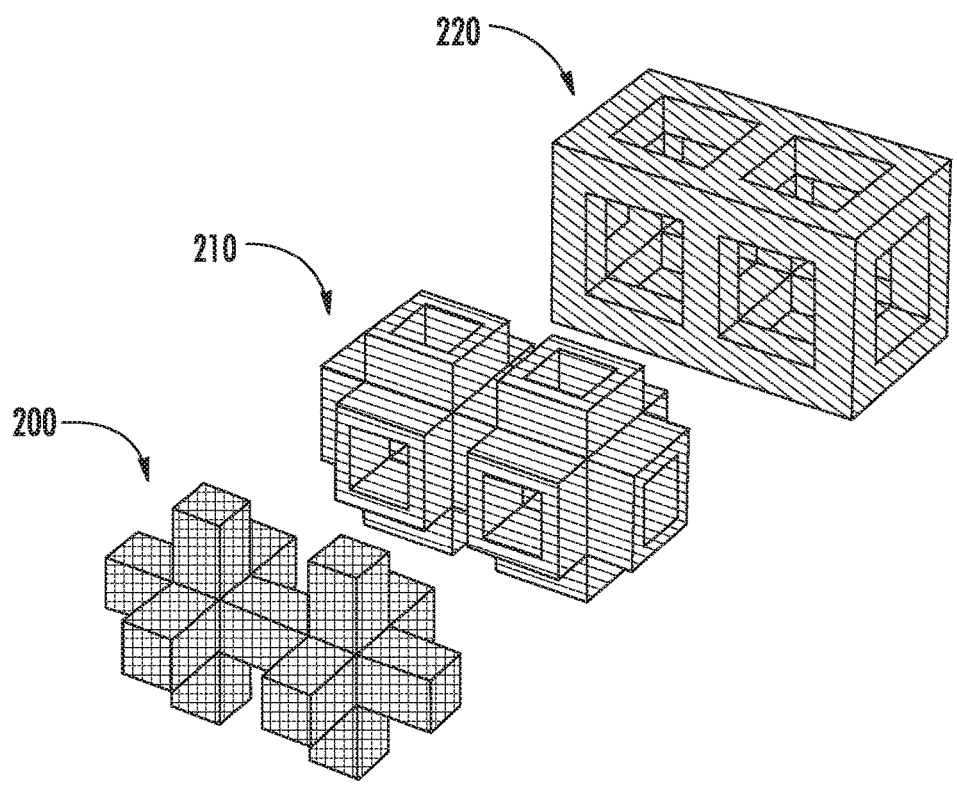
FIG. 2 illustrates example exploded views of the heat exchanger domains in accordance with various aspects described herein.

In FIG. 1, a first structure 100 can include a cavity 105. The cavity 105 can be a coolant portion. The cavity 105 can include coolant 110. A second structure 120 can substantially surround the first structure 100 to form a first chamber 125. The first chamber 125 can be a condenser portion. The first chamber 125 can be coupled to an evaporator portion. At least one of the evaporator portion and the condenser portion can include a heat exchange fluid 130. At least one of the evaporator portion and the condenser portion can include at least one wall partially or fully lined with three dimensional conformal vapor chamber wicking structures. A second chamber, formed between a housing and the second structure, can be a phase change material portion. The phase change material portion can include a phase change material 150. The phase change material 150 can be of a reversible type. The phase change material 150 can be paraffin wax. The phase change material 150 can be of an irreversible type. The phase change material 150 can include water. In FIG. 1, one unit cell is represented; however, it is to be appreciated that virtually any number of unit cells can be replicated to provide adequate heat transfer surfaces within the scope of this innovation. FIG. 2 illustrates how the coolant 200 can be shaped by a first cavity, how the heat exchange fluid 210 can be formed by the first chamber, and how the phase change material 220 can be formed by the second chamber. In FIG. 2, coolant 200, heat exchange fluid 210, and phase change material 220 manipulated by two unit cells are represented; however, it is to be appreciated that virtually any number of unit cells can be replicated to provide adequate heat transfer surfaces within the scope of this innovation.

Figure 3:
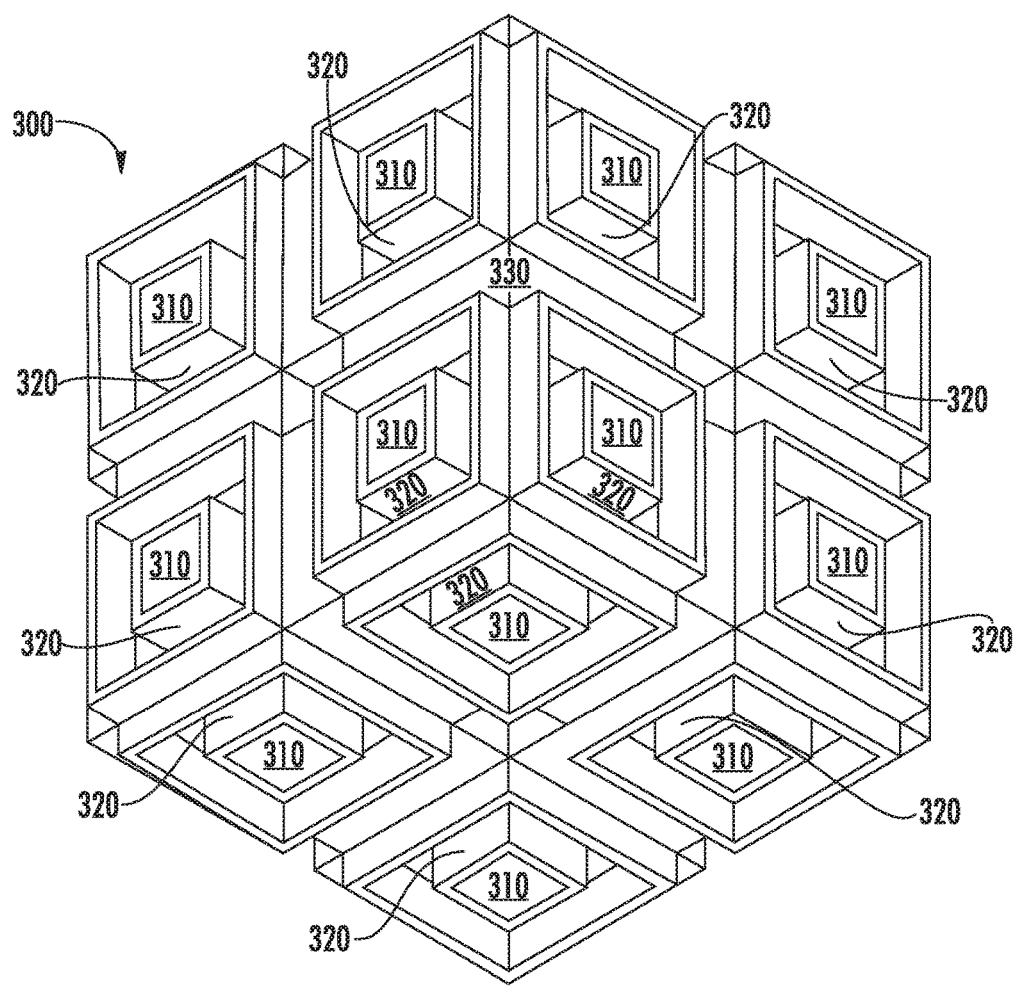
FIG. 3 illustrates an example trifurcated, multi-domain heat exchanger structure in accordance with various aspects described herein.
Figure 4:
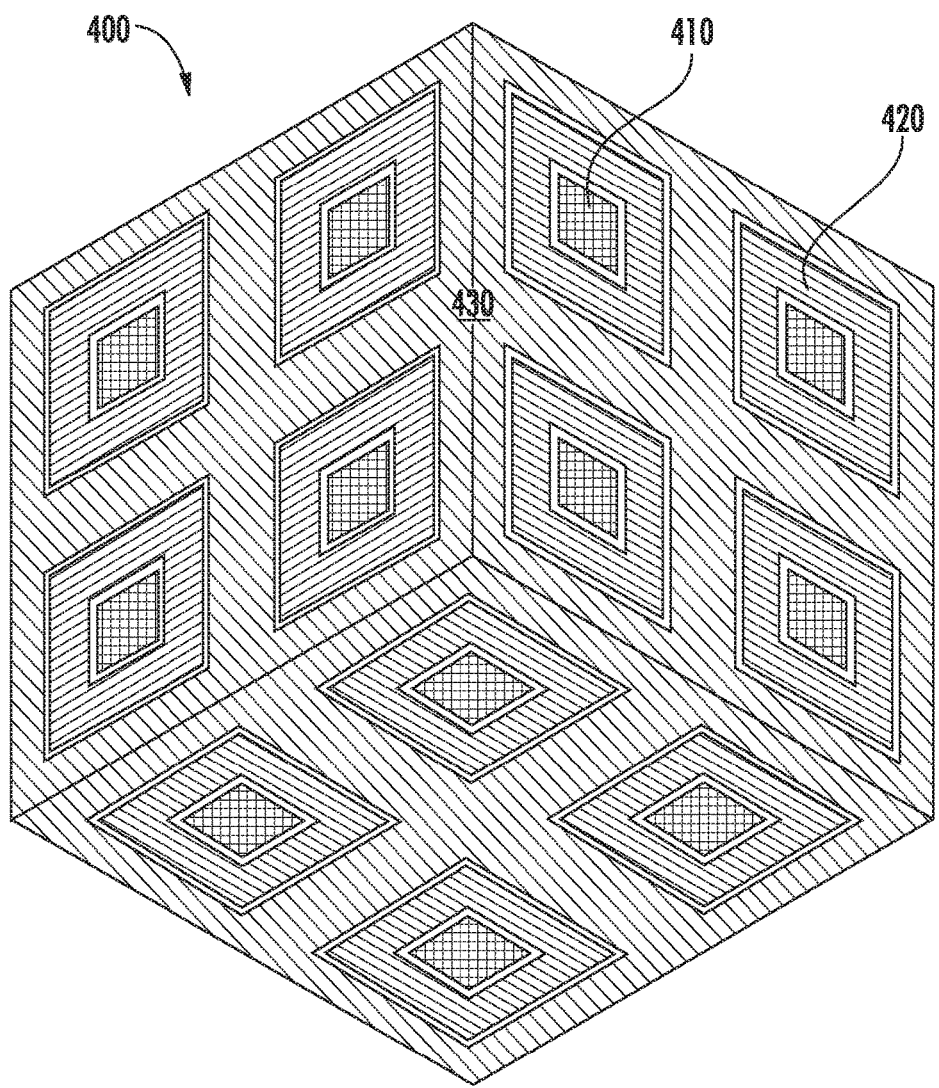
FIG. 4 illustrates an example trifurcated, multi-domain path representation in accordance with various aspects described herein.

FIG. 3 illustrates example trifurcated, multi-domain heat exchanger structure 300 in accordance with various aspects described herein. The trifurcated, multi-domain heat exchanger structure 300 can include a coolant portion 310, a condenser portion 320, and a phase change material portion 330. In FIG. 3, eight unit cells are represented; however, it is to be appreciated that virtually any number of unit cells can be replicated to provide adequate heat transfer surfaces within the scope of this innovation. FIG. 4 illustrates example trifurcated, multi-domain heat exchanger path representations in accordance with various aspects described herein. Particularly, FIG. 4 illustrates a heat exchanger 400, wherein separate fluid domains are illustrated. For instance, three separate domains are shown: a coolant domain 410, a vapor chamber (or condenser or evaporator) domain 420, and a phase change material domain 430. It can be appreciated that the domains are completely separated by the heat exchanger wall within the array of unit cells, but each domain is fully connected in the array. Additionally, it is to be appreciated that although FIGS. 1-4 illustrate three domains, virtually any quantity of domains are within the scope of the present innovation. Further, although FIGS. 1-4 illustrate three domains in a particular order (i.e., phase change material domain in the outermost layer, coolant domain in the innermost later, etc.), any or all of the three domains present in any order are within the scope of the present innovation. FIGS. 1-2 illustrate example exploded views of the heat exchanger domains in accordance with various aspects described herein.

Figure 5:
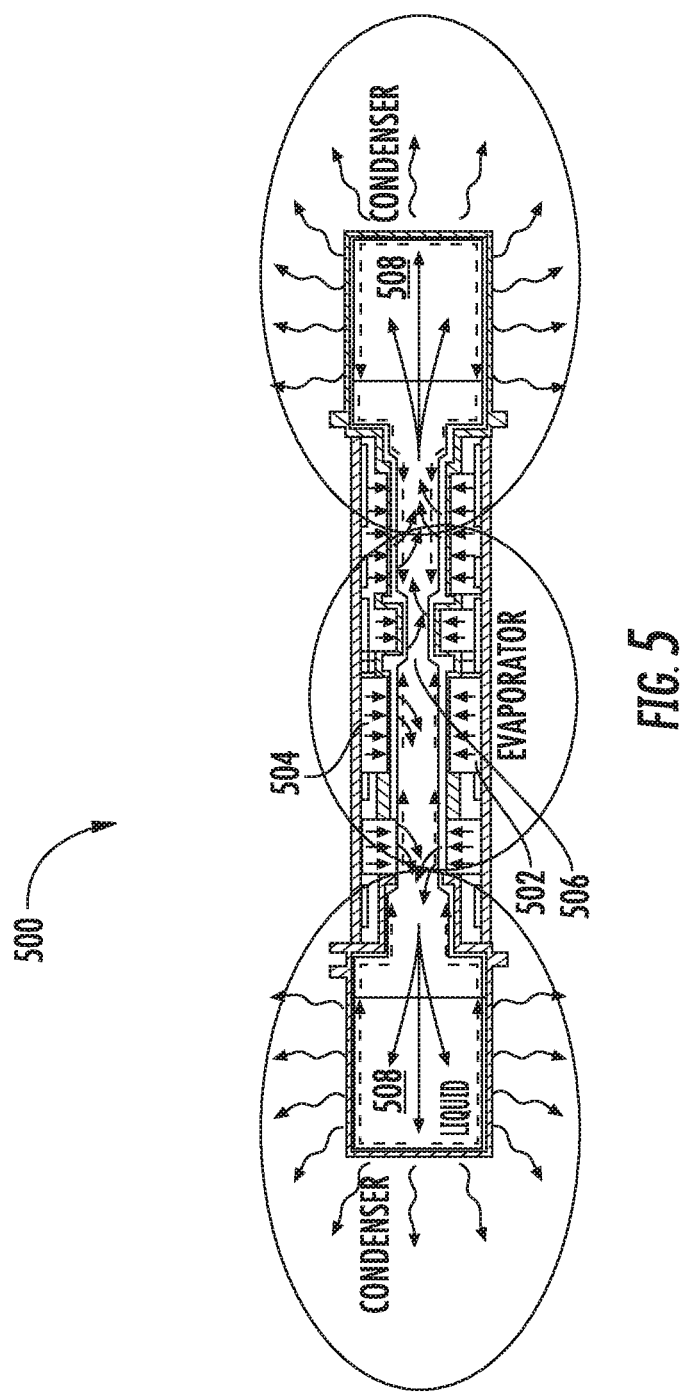
FIG. 5 illustrates an example cross section of a three-dimensional conformal vapor chamber in accordance with various aspects described herein.

Turning now to FIG. 5, illustrated is an example cross section of a three dimensional conformal vapor chamber (3D CVC) 500 in accordance with various aspects described herein. The cross section includes an evaporator section 506 and condenser sections 508 of the 3D CVC 500. The evaporator section 506 can be in communication with hot components 502, 504. The 3D CVC 500 can be an enclosed, hermetic vessel that has some or all of its internal surfaces lined with a wicking structure. The hermetic enclosure is initially evacuated and then charged with a measured amount of working fluid, for example distilled water. Due to the low pressure within the 3D CVC 500, some of the working fluid will evaporate, until the vapor pressure brings the 3D CVC 500 to equilibrium. When heat is applied to the evaporator section 506, more working fluid evaporates and thus absorbs heat from the evaporator section 506. The vapor moves within the 3D CVC 500 due to pressure gradients from the evaporation and condensation process. When the vapor reaches the condenser sections 508, it rapidly condenses, releasing heat to the condenser sections 508. Capillary forces within the wicking structure draw the fluid back to the evaporator section 506, where the cycle can repeat.

In FIG. 5, an evaporator section 506 is illustrated as a center section, and the side sections are illustrated as the condenser sections 508. Heat is represented by short-straight arrows going into or entering the evaporator section 506. Vapor creation is represented by solid arrows in the evaporator section 506 and condenser sections 508 and liquid is represented by dashed arrows in the evaporator section 506 and condenser sections 508, wherein evaporation of the fluid absorbs heat from the evaporator section 506. The condenser sections 508 are cooler than the evaporator section 506, therefore the vapor condenses and deposits heat in the condenser sections 508, as shown by the longer wavy arrows radiating away from the condenser sections 508.

In an embodiment of the subject innovation, one or more trifurcated nested heat exchangers (as shown in FIGS. 3-4) can replace a set of hollow fins used in a conventional heat exchanger arrangement. Returning to FIG. 4, the interior walls of one of the HX fluid domains, for example the condenser domain 420, can be fully lined with 3D CVC wicking structures, and the condenser domain 420 can be terminated into a manifold that joins to the 3D CVC 500 in such a way that there is a continuous layer of wick throughout the whole 3D CVC 500 and the condenser domain 420. Continuing, with this example, the coolant domain 410 can contain a cooling fluid, pumped from the outside of the HX and used to cool walls between the condenser domain 420 and the coolant domain 410 during normal operation. In addition, the phase change material domain 430 can contain a phase change material (PCM), with a phase transition temperature higher than the normal temperature of the coolant. During normal operation, a temperature of the coolant can be low enough, and the mass flow can be high enough, to maintain the condenser domain 420 below the transition temperature of the PCM while extracting the heat generated by the heat generating components (e.g., electronics, etc.) connected to the evaporator section 506 and transported to the condenser section 508 by the vapor inside the 3D CVC 500. If the condenser domain 420 temperature reaches the phase transition temperature of the PCM, due, for example, to increased thermal load at the condenser domain 420 or diminished coolant capacity in the coolant domain 410, then the PCM starts to transition and absorbs heat from the condenser domain 420 while maintaining it at the phase transition temperature until all of the PCM has transitioned phase. In an embodiment, trifurcated HX structure can have a very large surface area (e.g., the interface between the condenser domain 420 and the phase change material domain 430) to the PCM, and the thickness of individual PCM sections can be small, so heat can be transferred into the PCM very efficiently, enabling its operation under large heat fluxes.

Various sides of the trifurcated HX can be configured to form manifolds for the various working fluids within the HX. The manifold that encompasses the PCM domain can include an expansion area to allow for changes in volume of the PCM as it transitions through its phases. The PCM domain can be sealed (e.g., in the case of a reversible PCM) or vented to the environment (e.g., in the case of an evaporative or ablative PCM).

Figure 6:
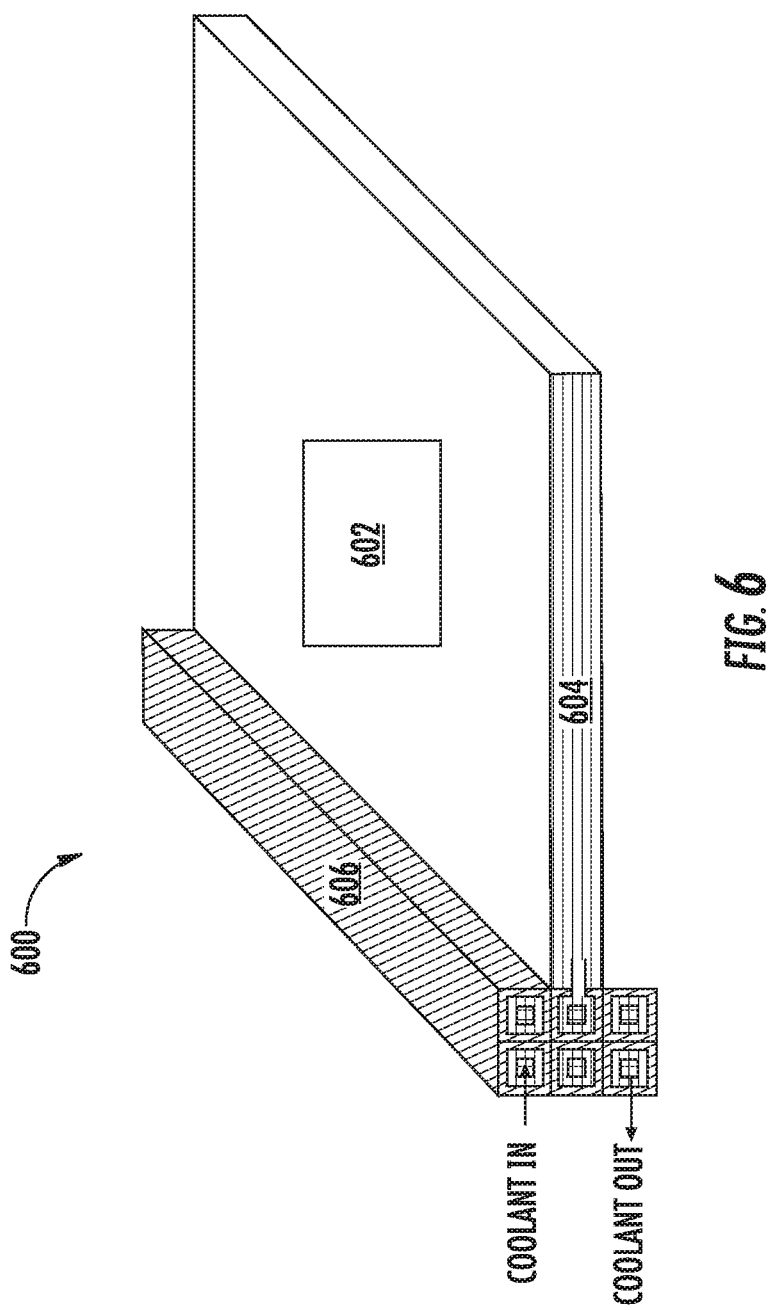
FIG. 6 illustrates an example schematic of a combined trifurcated heat exchanger and three-dimensional conformal vapor chamber in accordance with various aspects described herein.

FIG. 6 illustrates an example schematic of combined trifurcated heat exchanger (HX) and three dimensional conformal vapor chamber (3D CVC) 600 in accordance with various aspects described herein. A surface of a hot component 602 can be in communication with a surface of an evaporator 604 of the combined trifurcated heat exchanger (HX) and three dimensional conformal vapor chamber (3D CVC) 600. Vapor from the inside walls of the evaporator 604 diffuses into a condenser section of the HX 606, and condenses on either or both of an interface with a coolant section and an interface with a phase change material section. In a typical system there will be various conduction mechanisms (cold plates, etc.) that go into a loop of coolant and that loop of coolant will go into a HX, and that HX will exchange heat with another coolant fluid. An advantage of the present innovation is to remove the inner coolant loop and enable the heat generating components to transfer heat to the heat exchanger itself. Additionally, it will be apparent that the notation of evaporator and condenser can be notional/relative. For instance, at a first time, if the phase change material domain contains a PCM that is hot (e.g., melted due to heat absorption), and the coolant domain is cool, then at the first time the interface with the phase change domain can act as an evaporator, and the interface with the coolant domain can act as a condenser.

Figure 7:
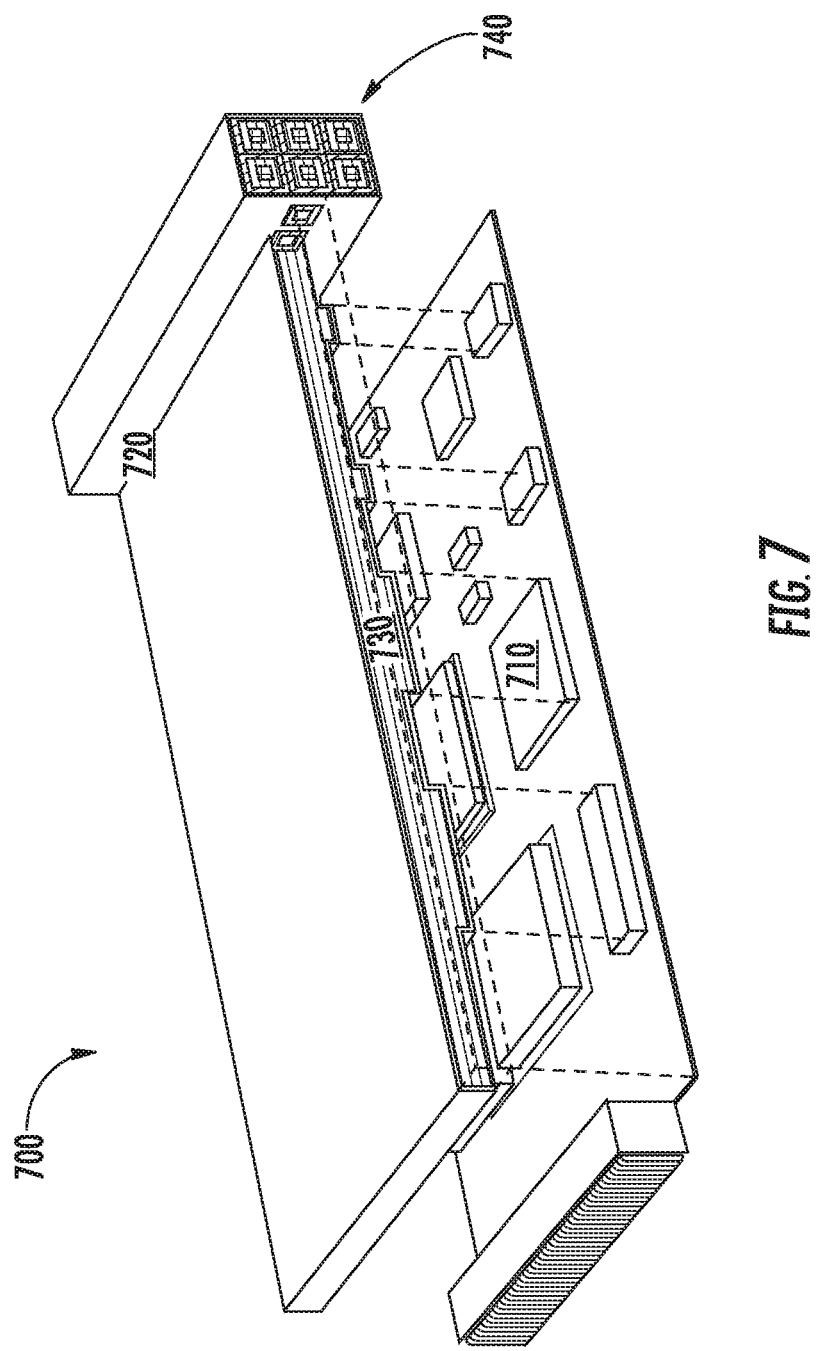
FIGS. 7-9 illustrate example schematics of additional configurations of the combined trifurcated heat exchanger and three-dimensional conformal vapor chamber in accordance with various aspects described herein.
Figure 8:
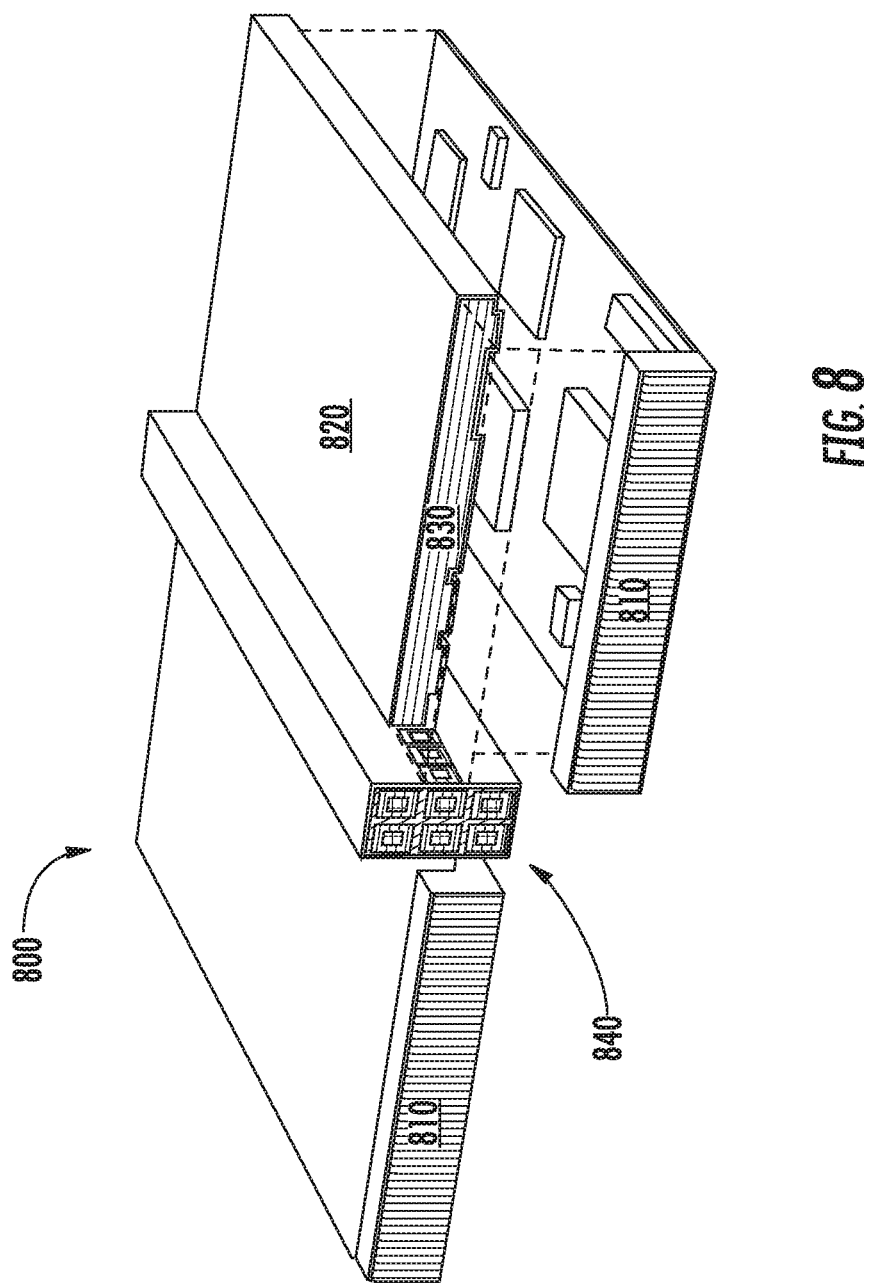
Figure 9:
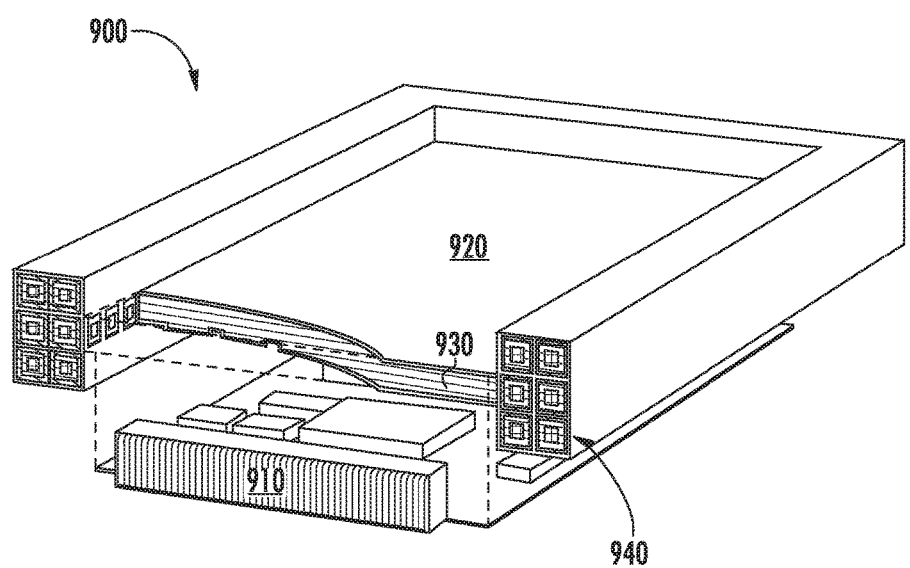
Figure 10:
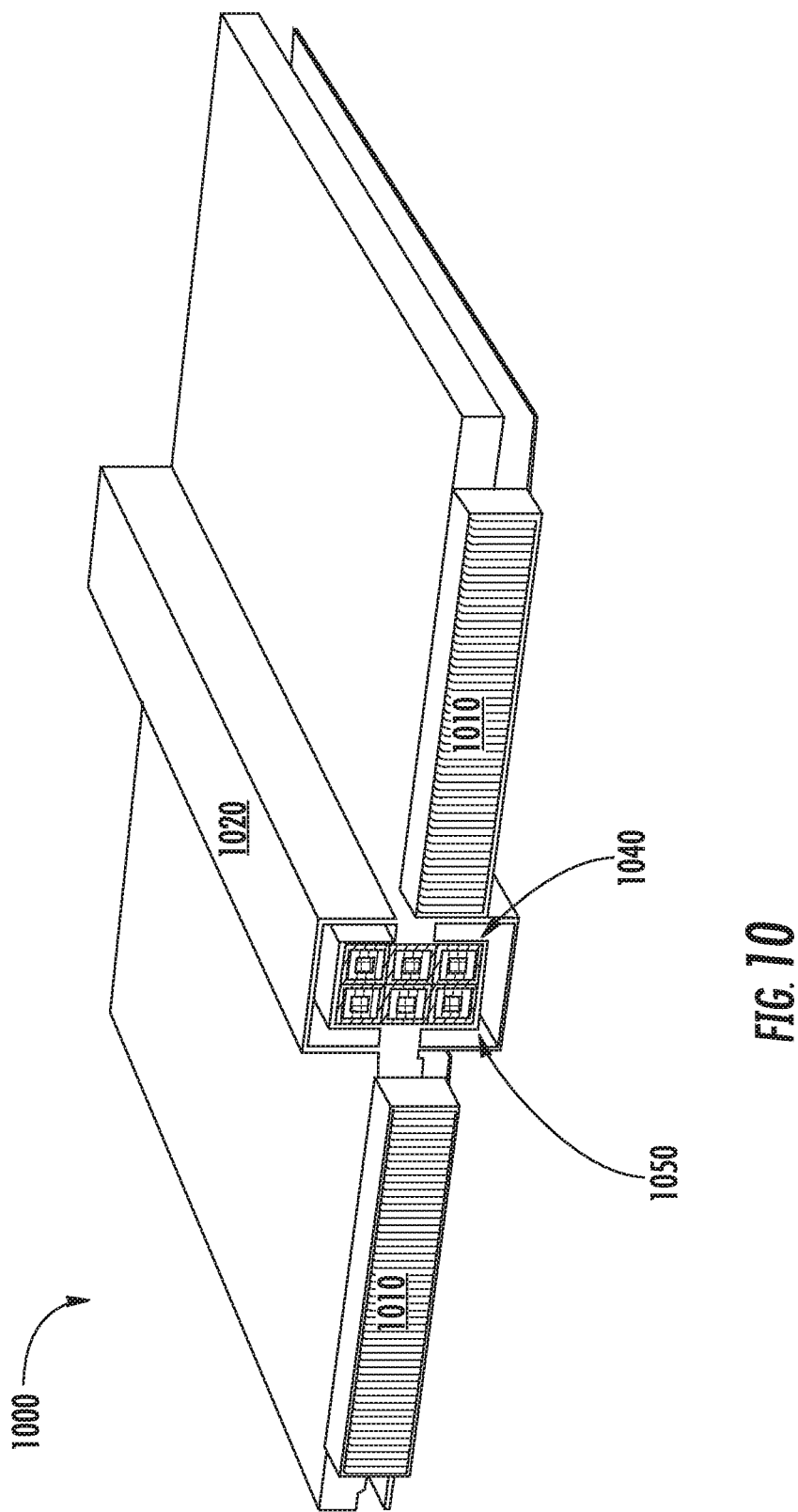
FIG. 10 illustrates an example schematic of additional configurations of the combined trifurcated heat exchanger and three-dimensional conformal vapor chamber having a vacuum shroud in accordance with various aspects described herein.

FIG. 7 illustrates an example HX and 3D CVC 700 like the one of FIG. 6 in communication with an electronic component 710. The example HX and 3D CVC 700 includes a housing 720, an evaporator 730, and a trifurcated heat exchanger 740. FIG. 8 illustrates an example HX and 3D CVC 800 with two evaporators 830, each evaporator 830 in communication with an electronic component 810. The example HX and 3D CVC 800 further includes a housing 820 and a trifurcated heat exchanger 840. Although FIG. 6 illustrates the HX on one side, it can be on multiple sides, or all sides, and can be determined as a function of the amount desired to be subtracted or removed. For example, FIG. 9 illustrates an example HX and 3D CVC 900 with a HX 940 on multiples sides in communication with an electronic component 910. The example HX and 3D CVC 900 further includes a housing 920 and an evaporator 930. FIG. 10 illustrates an example HX and 3D CVC 1000 in communication with two electronic components 1010. The example HX and 3D CVC 1000 includes a housing 1020, two evaporators, a trifurcated heat exchanger 1040, and a vacuum domain 1050. Portions or all of the device described in FIG. 6 can be further enclosed in a vacuum domain (or vacuum shroud) to provide thermal insulation between the HX/3D CVC and the environment (e.g., as shown in FIG. 10). In one approach, the outermost domain of the nested Trifurcated HX could be evacuated and sealed. In another approach, an additional shroud encompassing the exterior of the nested trifurcated HX would be additively manufactured and used to contain a vacuum (e.g., similar to a Dewar bottle). The areas of the device enclosed by the vacuum domain would vary with the application. Additionally, while three fluid domains are shown, multiple fluid domains can be used for the same fluid to create additional surface area. For example, in one arrangement one fluid domain can be connected to the vapor chamber, and the other two could be connected to a first fluid. As an additional example, one fluid domain could be connected to the vapor chamber, and each of the other domains can include separate fluids. As yet another example, one domain can include a phase change material, one domain can be connected to the vapor chamber, and another domain can contain a separate fluid.

It is to be further appreciated that the multi-domain heat exchanger of the current innovation can include virtually any number of domains. For example, the multi-domain heat exchanger can include two domains, wherein one domain essentially acts as the condenser of a heat pipe, and the other domain includes coolant. Furthermore, a two domain heat exchanger can include any combination of the domains illustrated in FIG. 6 (e.g., any combination of fluids).

Despite the condenser (or vapor chamber) domain being illustrated as included in the middle domain, the condenser domain can be in virtually any domain, and can be selected based at least in part on the details of a particular application. The heat exchanger sections can be connected to multiple sides of the 3D CVC in quantities and shapes that fit the application. For example, if multiple HX sections are used, then the HX domains can be connected or separate, and the 3DCVC domains corresponding to the various HX sections can also be connected or separated. It is possible, in a single instantiation of this innovation, to have multiple 3D CVC domains each served by its own HX and combination of coolants and PCMs.

Multiple operating modes are possible within the scope of the current innovation. For example, during a first time period where there is a high heat dissipation period, virtually all of the heat from heat generating components can be transferred to the domain containing the PCM. During this operating mode, the HX may not be functioning, operating, or otherwise working. When the period is over, the operating mode can control, influence or otherwise instruct fluid through the HX in order to re-solidify the PCM. Typically, PCM is good for a single use; however, the example operating mode would enable a way to re-solidify the PCM when needed.

What is claimed is:

1. A system for cooling a surface comprising:
    a housing comprising:
        an evaporator portion; and
        a multi-domain heat exchanger having at least one trifurcated heat exchange portion comprising an array of unit cells defining a plurality of nested trifurcated domains, the array of unit cells of the multi-domain heat exchanger comprising:
            a first structure comprising a trifurcated condenser portion, the trifurcated condenser portion coupled to the evaporator portion;
            a second structure comprising a trifurcated coolant portion, the trifurcated coolant portion substantially surrounded by the trifurcated condenser portion; and
            a trifurcated phase change material portion substantially surrounding the trifurcated condenser portion, the trifurcated phase change material portion configured to receive a phase change material.

2. The system of claim 1, wherein at least one of the evaporator portion and the trifurcated condenser portion comprises a heat exchange fluid.

3. The system of claim 1, wherein at least one of the evaporator portion and the trifurcated condenser portion comprises at least one wall at least partially lined with vapor chamber wicking structures.

4. The system of claim 1, wherein the trifurcated phase change material portion comprises a phase change material.

5. The system of claim 4, wherein the phase change material is of a reversible type.

6. The system of claim 5, wherein the phase change material comprises paraffin wax.

7. The system of claim 4, wherein the phase change material is of an irreversible type.

8. The system of claim 7, wherein the phase change material comprises water.

9. The system of claim 1, wherein the housing further comprises a vacuum portion.

10. The system of claim 1, wherein:
    the trifurcated coolant portion defines a first cavity, the first cavity configured to receive a coolant;
    the trifurcated condenser portion defines a first chamber, the first chamber configured to receive a heat transfer substance; and
    the trifurcated phase change material portion is defined at least in part by the trifurcated condenser portion.

11. The system of claim 10,
    wherein the system further comprises:
    a third structure surrounding the trifurcated phase change material portion; and
    a fourth structure forming a second cavity, wherein the second cavity is in communication with the first chamber, wherein the fourth structure is in communication with the surface;
    wherein at least one of the first chamber and the second cavity comprises a condenser.

12. The system of claim 10, wherein at least one of the first chamber and the second cavity comprises at least one wall at least partially lined with vapor chamber wicking structures.

13. The system of claim 1, comprising:
    a multi-phase heat exchanger, the multi-phase heat exchanger comprising the multi-domain heat exchanger; and
    a heat spreader comprising a vapor chamber, the vapor chamber comprising the evaporator portion.

14. The system of claim 13, wherein the vapor chamber is in communication with the multi-domain heat exchanger.

15. The system of claim 14, wherein at least one of the domains comprises a condenser of the vapor chamber.

16. The system of claim 14, wherein at least one of the domains comprises a coolant.

17. The system of claim 14, wherein at least one of the domains comprises phase change material.

18. The system of claim 14, wherein the multi-domain heat exchanger comprises three domains.

19. The system of claim 13, wherein at least one of the multi-phase heat exchanger and the vapor chamber are at least partially enclosed in a vacuum domain.

20. The system of claim 19, wherein the vacuum domain provides thermal insulation between an environment and at least one of the multi-phase heat exchanger and the vapor chamber.

* * * * *